US008828779B2

(12) United States Patent
Zhao

(10) Patent No.: US 8,828,779 B2
(45) Date of Patent: Sep. 9, 2014

(54) BACKSIDE ILLUMINATION (BSI) CMOS IMAGE SENSOR PROCESS

(71) Applicant: United Microelectronics Corp., Hsin-Chu (TW)

(72) Inventor: Xin Zhao, Singapore (SG)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 86 days.

(21) Appl. No.: 13/665,937

(22) Filed: Nov. 1, 2012

(65) Prior Publication Data

US 2014/0120653 A1     May 1, 2014

(51) Int. Cl.
*H01L 21/00* (2006.01)
*H01L 27/146* (2006.01)
*H01L 31/0232* (2014.01)

(52) U.S. Cl.
CPC ...... *H01L 27/1464* (2013.01); *H01L 27/14627* (2013.01); *H01L 27/14625* (2013.01); *H01L 27/14629* (2013.01); *H01L 27/14685* (2013.01); *H01L 27/14643* (2013.01); *H01L 31/0232* (2013.01); *H01L 31/02327* (2013.01)
USPC ................... 438/70; 438/72; 438/60; 438/69; 257/E21.532

(58) Field of Classification Search
CPC ..................... H01L 27/1464; H01L 27/14625; H01L 27/14627; H01L 27/14629; H01L 27/14643; H01L 27/14685; H01L 31/02327; H01L 31/0232

USPC ............. 438/70, 72, 57, 59, 60; 257/E21.532
See application file for complete search history.

(56) References Cited

U.S. PATENT DOCUMENTS

| | | |
|---|---|---|
| 3,930,295 A | 1/1976 | Rose |
| 4,148,048 A | 4/1979 | Takemoto |
| 4,460,912 A | 7/1984 | Takeshita |
| 4,533,624 A | 8/1985 | Sheppard |
| 4,644,172 A | 2/1987 | Sandland |
| 4,745,451 A | 5/1988 | Webb |
| 4,951,104 A | 8/1990 | Kato |
| 5,070,380 A | 12/1991 | Erhardt |
| 5,241,417 A | 8/1993 | Sekiguchi |
| 5,246,803 A | 9/1993 | Hanrahan |
| 5,294,288 A | 3/1994 | Melpolder |
| 5,321,297 A | 6/1994 | Enomoto |
| 5,466,926 A | 11/1995 | Sasano |
| 5,587,696 A | 12/1996 | Su |
| 5,625,210 A | 4/1997 | Lee |
| 5,650,864 A | 7/1997 | Tseng |
| 5,830,624 A | 11/1998 | Bae |
| 5,880,495 A | 3/1999 | Chen |
| 5,977,535 A | 11/1999 | Rostoker |
| 6,006,764 A | 12/1999 | Chu |
| 6,071,826 A | 6/2000 | Cho |
| 6,081,018 A | 6/2000 | Nakashiba |

(Continued)

OTHER PUBLICATIONS

Kuribayashi, Hydrogen pressure dependence of trench corner rounding during hydrogen annealing, Jul. 24, 2004.

*Primary Examiner* — Michael Trinh
(74) *Attorney, Agent, or Firm* — Winston Hsu; Scott Margo

(57) ABSTRACT

A backside illumination (BSI) CMOS image sensing process includes the following steps. A substrate having an active side is provided. A curving process is performed to curve the active side. A reflective layer is formed on the active side, so that at least a curved mirror is formed on the active side.

17 Claims, 4 Drawing Sheets

(56) References Cited

U.S. PATENT DOCUMENTS

| | | |
|---|---|---|
| 6,087,211 A | 7/2000 | Kalnitsky |
| 6,124,200 A | 9/2000 | Wang |
| 6,294,313 B1 | 9/2001 | Kobayashi |
| 6,297,160 B1 | 10/2001 | Chien |
| 6,338,976 B1 | 1/2002 | Huang |
| 6,352,876 B1 | 3/2002 | Bordogna |
| 6,369,417 B1 | 4/2002 | Lee |
| 6,376,797 B1 | 4/2002 | Piwczyk |
| 6,388,278 B1 | 5/2002 | Suzuki |
| 6,407,415 B2 | 6/2002 | Lee |
| 6,433,844 B2 | 8/2002 | Li |
| 6,482,669 B1 | 11/2002 | Fan |
| 6,514,810 B1 | 2/2003 | Kim |
| 6,566,151 B2 | 5/2003 | Yeh |
| 6,617,189 B1 | 9/2003 | Chen |
| 6,632,700 B1 | 10/2003 | Fan |
| 6,641,464 B1 | 11/2003 | Steere, III |
| 6,664,191 B1 | 12/2003 | Kim |
| 6,730,555 B2 | 5/2004 | Kim |
| 6,794,215 B2 | 9/2004 | Park |
| 6,821,809 B2 | 11/2004 | Abe |
| 6,841,848 B2 | 1/2005 | MacNamara |
| 6,846,722 B2 | 1/2005 | Lee |
| 6,849,533 B2 | 2/2005 | Chang |
| 6,872,584 B2 | 3/2005 | Nakashiba |
| 6,921,934 B2 | 7/2005 | Patrick |
| 6,933,972 B2 | 8/2005 | Suzuki |
| 6,953,608 B2 | 10/2005 | Leu |
| 6,960,512 B2 | 11/2005 | Cheng |
| 7,006,294 B2 | 2/2006 | Steenblik |
| 7,078,779 B2 | 7/2006 | Wang |
| 7,115,924 B1 | 10/2006 | LaMaster |
| 7,129,172 B2 | 10/2006 | Morrow |
| 7,180,044 B2 | 2/2007 | Yu |
| 7,199,439 B2 | 4/2007 | Farnworth |
| 7,229,745 B2 | 6/2007 | Lamarre |
| 7,315,359 B2 | 1/2008 | Hong |
| 7,328,915 B2 | 2/2008 | Smith |
| 7,425,460 B2 | 9/2008 | Pain |
| 7,498,190 B2 | 3/2009 | Kao |
| 7,510,975 B2 * | 3/2009 | Kishimoto et al. ......... 438/706 |
| 7,648,851 B2 | 1/2010 | Fu |
| 7,889,859 B1 * | 2/2011 | Batai ..................... 379/266.1 |
| 2001/0023086 A1 | 9/2001 | Park |
| 2004/0122328 A1 | 6/2004 | Wang |
| 2005/0024520 A1 | 2/2005 | Yamamoto |
| 2005/0103983 A1 | 5/2005 | Yamaguchi |
| 2005/0121599 A1 | 6/2005 | Mouli |
| 2005/0186739 A1 | 8/2005 | Wang |
| 2005/0247963 A1 | 11/2005 | Chen |
| 2005/0274988 A1 | 12/2005 | Hong |
| 2005/0274996 A1 | 12/2005 | Iwawaki |
| 2006/0054946 A1 | 3/2006 | Baek |
| 2006/0124833 A1 | 6/2006 | Toda |
| 2006/0146230 A1 | 7/2006 | Joon |
| 2006/0146412 A1 | 7/2006 | Kim |
| 2006/0172451 A1 | 8/2006 | Park |
| 2006/0183265 A1 | 8/2006 | Oh |
| 2006/0231898 A1 | 10/2006 | Jeong |
| 2007/0010042 A1 | 1/2007 | Li |
| 2007/0012970 A1 | 1/2007 | Mouli |
| 2007/0018073 A1 | 1/2007 | Hsu |
| 2007/0023851 A1 | 2/2007 | Hartzell |
| 2007/0031988 A1 | 2/2007 | Agranov |
| 2007/0052050 A1 | 3/2007 | Dierickx |
| 2007/0072326 A1 | 3/2007 | Zheng |
| 2007/0096173 A1 | 5/2007 | Kim |
| 2007/0117253 A1 | 5/2007 | Hsu |
| 2007/0158772 A1 | 7/2007 | Boettiger |
| 2007/0166649 A1 | 7/2007 | Yu |
| 2007/0202696 A1 | 8/2007 | Inuiya |
| 2008/0036020 A1 | 2/2008 | Ko |
| 2008/0055733 A1 | 3/2008 | Lim |
| 2008/0079103 A1 | 4/2008 | Liao |
| 2008/0121805 A1 | 5/2008 | Tweet |
| 2008/0121951 A1 | 5/2008 | Kao |
| 2008/0157144 A1 | 7/2008 | Lee |
| 2008/0169546 A1 | 7/2008 | Kwon |
| 2008/0265348 A1 | 10/2008 | Maas |
| 2009/0050947 A1 * | 2/2009 | Dungan et al. ............. 257/294 |
| 2009/0066954 A1 | 3/2009 | Opsal |
| 2009/0121264 A1 | 5/2009 | Kao |
| 2009/0124037 A1 | 5/2009 | Yu |
| 2009/0127643 A1 | 5/2009 | Lu |
| 2009/0134484 A1 | 5/2009 | Lin |
| 2009/0168181 A1 | 7/2009 | Su |
| 2009/0194671 A1 * | 8/2009 | Nozaki et al. ............. 250/208.1 |
| 2009/0200585 A1 | 8/2009 | Nozaki |
| 2009/0200586 A1 | 8/2009 | Mao |
| 2009/0212335 A1 | 8/2009 | Kao |
| 2009/0256258 A1 | 10/2009 | Kreupl |
| 2009/0294888 A1 | 12/2009 | Tsai |
| 2009/0321862 A1 | 12/2009 | Yu |
| 2010/0003623 A1 | 1/2010 | Liu |
| 2010/0038688 A1 | 2/2010 | Wu |
| 2010/0044813 A1 | 2/2010 | Wu |
| 2010/0096359 A1 | 4/2010 | Shiu |
| 2010/0144156 A1 | 6/2010 | Shih |
| 2010/0148290 A1 | 6/2010 | Park |
| 2010/0159632 A1 | 6/2010 | Rhodes |
| 2010/0315734 A1 | 12/2010 | Wu |
| 2011/0057277 A1 | 3/2011 | Yu |
| 2011/0291219 A1 * | 12/2011 | Kwon ..................... 257/447 |

* cited by examiner

BACKSIDE ILLUMINATION (BSI) CMOS IMAGE SENSOR PROCESS

BACKGROUND OF THE INVENTION

1. Field of the Invention

The present invention relates generally to a backside illumination (BSI) CMOS image sensing process, and more specifically to a backside illumination (BSI) CMOS image sensing process that forms curved mirrors on an active side of a substrate.

2. Description of the Prior Art

Back side illumination (BSI) image sensors are popular image sensors in the present industry. Back side illumination (BSI) image sensor fabrication can be integrated into conventional semiconductor processes, and therefore back side illumination (BSI) image sensors have advantages of low cost, tiny size, and high integration. Back side illumination (BSI) image sensors also have advantages of low operating voltage, low power consumption, high quantum efficiency, low read-out noise, and random access. Therefore, back side illumination (BSI) image sensors are adopted broadly in electronic products, such as PC cameras and digital cameras.

A conventional back side illumination (BSI) image sensor structure can be divided by function into a light sensing area and a peripheral electronic circuit area. The light sensing area has a plurality of photodiodes arranged in an array, and MOS transistors to detect the light intensity, i.e. a reset transistor, a current source follower and a row selector. The peripheral electronic circuit area connects interconnects to external connections. A principle function of the back side illumination (BSI) image sensor is to divide incident beams into combinations of light with different wavelengths. The light is received by a plurality of imaging devices on the semiconductor substrate and transformed into digital signals of different intensity. For instance, an incident beam is divided into a combination of red, green and blue light and received by corresponding photodiodes. Each photodiode transforms the light intensity into digital signals.

SUMMARY OF THE INVENTION

The present invention provides a backside illumination (BSI) CMOS image sensing process, which forms at least a curved mirror on an active side of a substrate, so that incident light penetrating a light sensing area in the substrate can be reflected back to the light sensing area, so as to achieve a higher quantum efficiency in the light sensing area.

The present invention provides a backside illumination (BSI) CMOS image sensing process including the following steps. A substrate having an active side is provided. A curving process is performed to curve the active side. A reflective layer is formed on the active side, thereby forming at least a curved mirror on the active side.

According to the above, the present invention provides a backside illumination (BSI) CMOS image sensing process, which forms at least a curved mirror on an active side of a substrate, so that incident light penetrating a light sensing area of the substrate can be reflected back to the light sensing area, so the quantum efficiency of the light sensing area can being higher.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
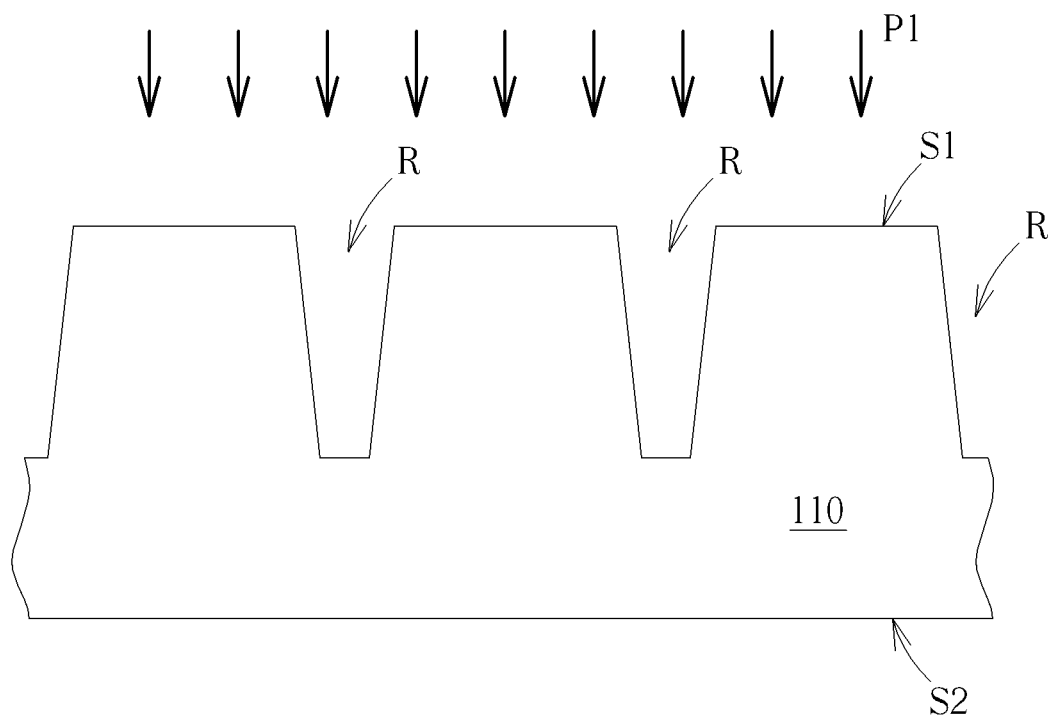
FIGS. 1-8 schematically depict cross-sectional views of a backside illumination (BSI) CMOS image sensing process according to an embodiment of the present invention.

FIGS. 1-8 schematically depict cross-sectional views of a backside illumination (BSI) CMOS image sensing process according to an embodiment of the present invention. As shown in FIG. 1, a substrate 110 having a front side S1 and a back side S2 is provided, wherein the substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. In this embodiment, the front side S1 of the substrate 110 is an active side.

Figure 2:
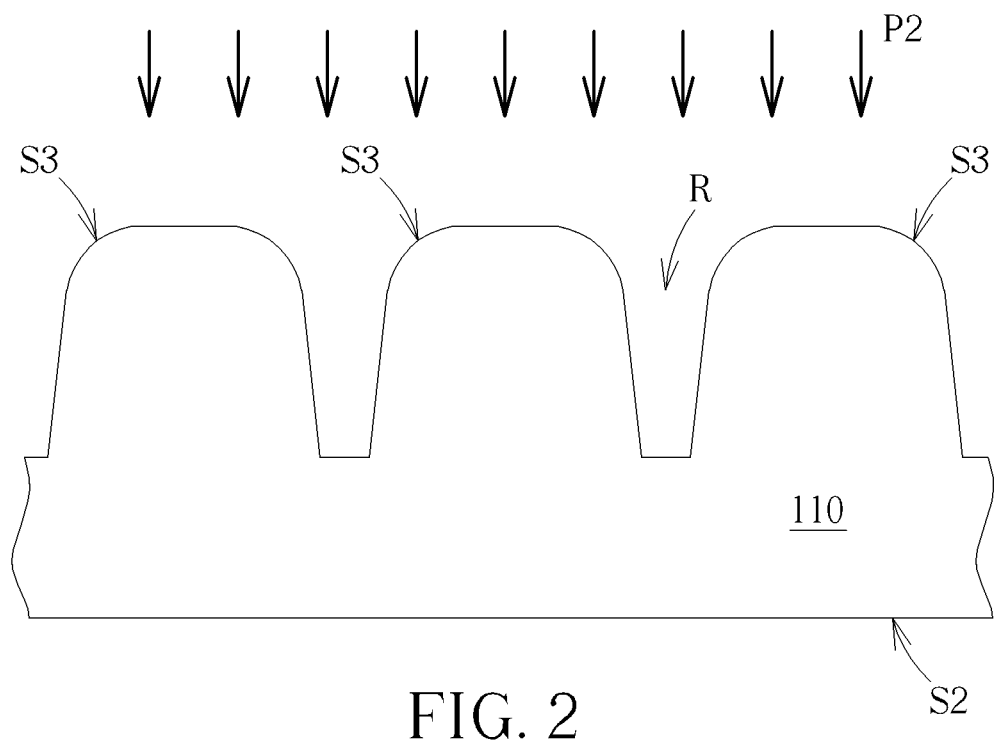

Please referring to FIGS. 1-2, a curving process is performed to curve a part of the front side S1 of the substrate 110, and a plurality of cambered surfaces S3 is therefore formed. As shown in FIG. 1, an etching process P1 is performed to etch the substrate 110 from the front side S1 of the substrate 110, and a plurality of recesses R is therefore formed in the substrate 110. As shown in FIG. 2, an annealing process P2 is performed to curve the substrate 110 between each of the recesses R. More precisely, the sidewalls of the recesses R at the openings are curved first during the annealing process P2, and then the front side S1 of the substrate 110 is curved. The curving progress can be controlled by adjusting the parameters of the annealing process P2 such as time, temperature, pressure or etc and so as to fit with the size of the substrate 110 between each of the recesses R. In this embodiment, the annealing process P2 is a hydrogen-containing annealing process, but it is not limited thereto. In a preferred embodiment, the processing temperature of the hydrogen annealing process is larger than 1000° C. for curving the front side S1 of the substrate 110. In a still preferred embodiment, the processing temperature of the hydrogen-containing annealing process is 1000° C., the processing pressure is 500 Torrs and the processing time is 3 minutes to obtain the desired cambered surfaces for forming the desired curved mirrors in later processes.

The curving process in this embodiment includes the following steps. Recesses R are formed in the substrate 110; a hydrogen-containing annealing process is performed to curve the front side S1 of the substrate 110 between the recesses R. In another embodiment, processes may be performed directly to curve the front side S1 of the substrate 110 without forming the recesses. Moreover, the substrate 110 is not curved if an oxide layer (not shown) is formed on the front side S1 of the substrate 110. Thus, as only parts of the substrate 110 need to be curved, the oxide layer (not shown) can be formed on the other parts of the substrate 110 that do not need to be curved, so that the other parts of the substrate 110 will not be curved. Therefore, the effect of curving parts of the substrate 110 can be achieved, and a plurality of curved mirrors can be formed on the substrate 110 locally in later processes.

Figure 3:
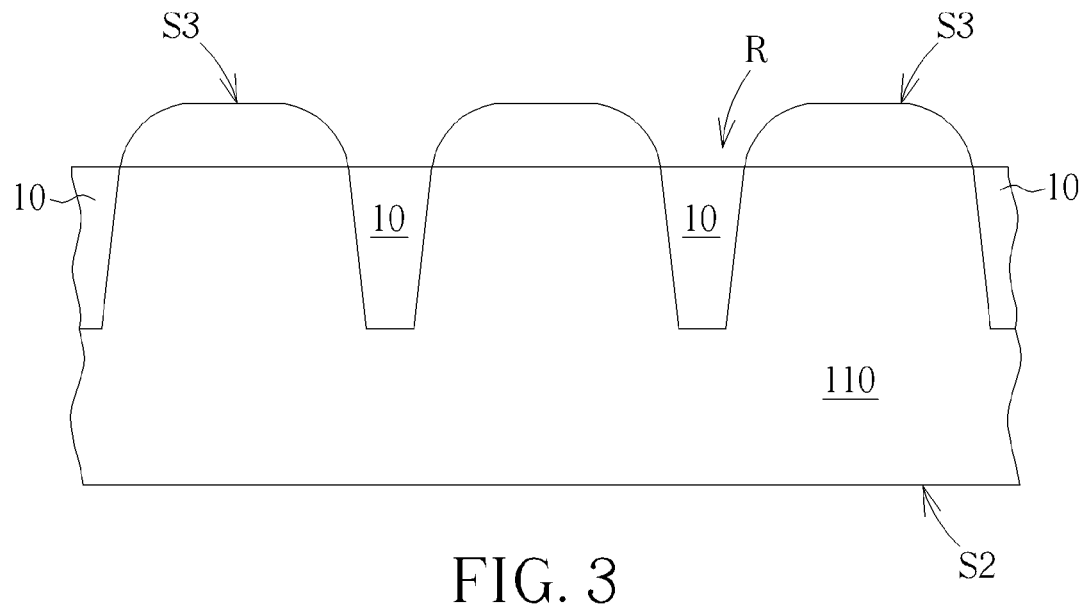

As shown in FIG. 3, an isolating material 10 is filled into each of the recesses R, wherein filling the isolating material 10 includes the following steps. An isolating material (not shown) is filled into the recesses R, and then the isolating material (not shown) is planarized and etched back to form the isolating material 10, which is lower than the cambered surfaces S3 of the substrate 110. In this embodiment, the isolating material 10 is a shallow trench isolating material such as dioxide or silicon nitride for forming a shallow trench isolation (STI) structure or a deep trench isolation (DTI) structure in each of the recesses R, wherein the depth of the shallow trench isolation (STI) structure is about 2500-4000 angstroms and the depth of the deep trench isolation (STI) structure is about 25000-36000 angstroms, but it is not limited thereto. In other words, the curving process of the present invention can be integrated into a current shallow trench isolation (STI) process or a deep trench isolation (DTI) process. That is to say, a mask, such as a patterned silicon nitride layer (not shown), may be formed on the front side S1 of the substrate 110 to form a plurality of recesses R, and then the mask is removed. After the curving process is performed, the isolating material is filled into each of the recesses and the isolating material is planarized, so that the shallow trench isolation (STI) structure is formed, and the substrate between each of the shallow trench isolation (STI) structures can be an active area having cambered surfaces S3. Moreover, as a planarization process, such as a chemical mechanical polishing (CMP) process, is performed, the isolating material in the recesses R is preferred to be over-polished or etched back, thereby enabling the cambered surfaces S3 to protrude from the surface of the shallow trench isolation (STI) structures.

Figure 4:
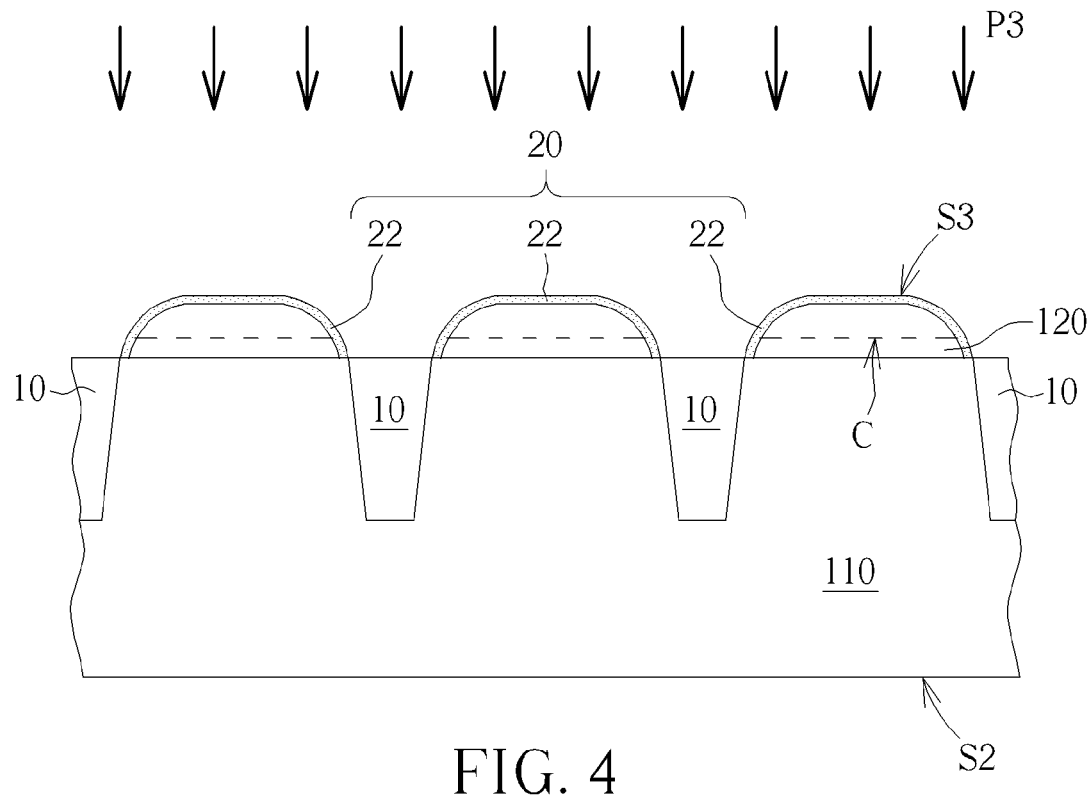

As shown in FIG. 4, light sensing areas 120 are formed in the substrate 110. The light sensing area 120 may be a photodiode (not shown), but it is not limited thereto, wherein the method of forming the photodiode (not shown) is known in the art, and is not described herein. The light sensing area 120 includes a P-N junction C, wherein incident light will be absorbed and be transformed into electron/hole pairs, so as to generate sensing current. As the light sensing area 120 is a source/drain of a MOS transistor (not shown) in a CMOS image sensor, the sensing current will be transferred to other components through the MOS transistor (not shown), wherein the other components may be MOS transistors such as a reset transistor, a current source follower or a row selector etc for transforming the sensing light into digital signals, or MOS transistors in a peripheral circuit region, but it is not limited thereto.

A reflective layer 20 is formed on the cambered surfaces S3 of the substrate 110, thereby forming at least a curved mirror 22 on the cambered surface S3. The reflective layer 20 may be formed by a plurality of mirrors composed by reflective materials such as metal, or may be formed by a film composed of multi-layers of different materials such as silicon dioxide or silicon nitride etc, which can achieve total reflectivity by using different materials with different reflectivity. Since the surfaces of the curved mirrors 22 facing the substrate 110 are concave mirrors, incident light emitted into the light sensing areas 120 from the back side S2 of the substrate 110 can be reflected back to the light sensing areas 120. Ina preferred embodiment, the focus of each of the curved mirrors 22 is disposed on the P-N junction C, so that light penetrating through the P-N junction C can be reflected by each of the curved mirrors 22 and then be concentrated on the P-N junction C again. This induces that the light is transformed into electron/hole pairs and the quantum efficiency of the light sensing area 120 can therefore be improved.

In this embodiment, since each of the light sensing areas 120 is a source or a drain of each MOS transistor, a salicide process P3 can be performed directly to respectively form a metal silicide on the source or the drain of each MOS transistor to be the reflective layer 20, so that metal silicide can be formed on each of the cambered surfaces S3. The metal silicide may be a nickel/silicide, and the thickness of the metal silicide is preferred to be larger than 200 angstroms so as to reflect light more effectively, but it is not limited thereto. In this embodiment, the salicide process can be performed paired with a MOS transistor process of a logical electrical circuit area. For example, after the isolating material 10 is formed, a gate formation process and a source/drain formation process are sequentially performed and then the salicide process is performed. Thus, the light sensing areas 120 is covered during the MOS transistor process of the logical electrical circuit area until the salicide process is performed and the area for forming the metal silicide is exposed.

Figure 5:
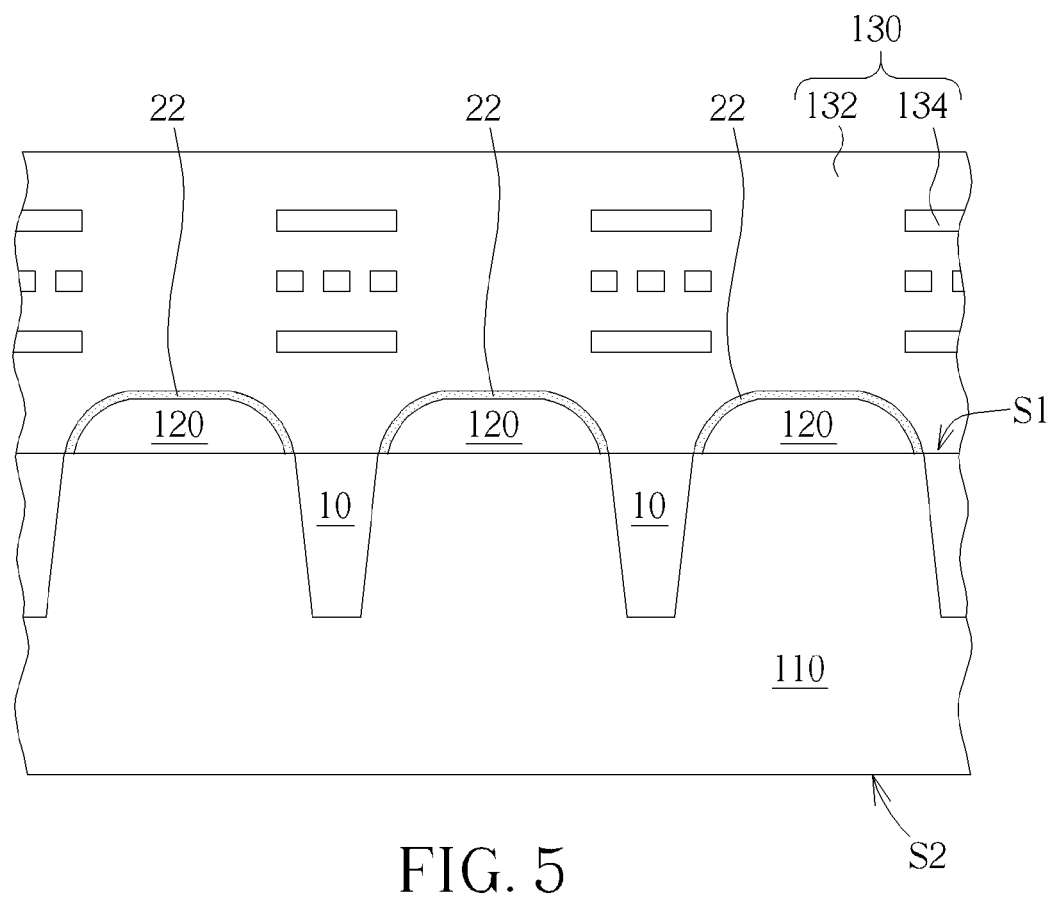

After the metal silicide is formed, an interdielectric layer is formed to cover the metal silicide and fill the recess R on the isolating material 10. For instance, as shown in FIG. 5, contact plugs (not shown) and an interconnect structure 130 are formed on the front side S1 of the substrate 110. The interconnect structure 130 may include a plurality of dielectric layers 132, such as interdielectric layers or intermetal dielectrics (IMD), and a plurality of metal layers 134. The dielectric layer 132 may be an oxide layer, and the metal layer 134 may be composed of aluminum or copper, but it is not limited thereto. More specifically, the interconnect structure 130 may be formed through the following steps. Each of the dielectric layers 132 is respectively formed and etched to form recesses (not shown) in each of the dielectric layers 132; then, metal such as aluminum or copper is filled into the recesses (not shown) to form the metal layer 134; and then these processes may be performed repeatedly to form the stacked structure of the interconnect structure 130.

Figure 6:
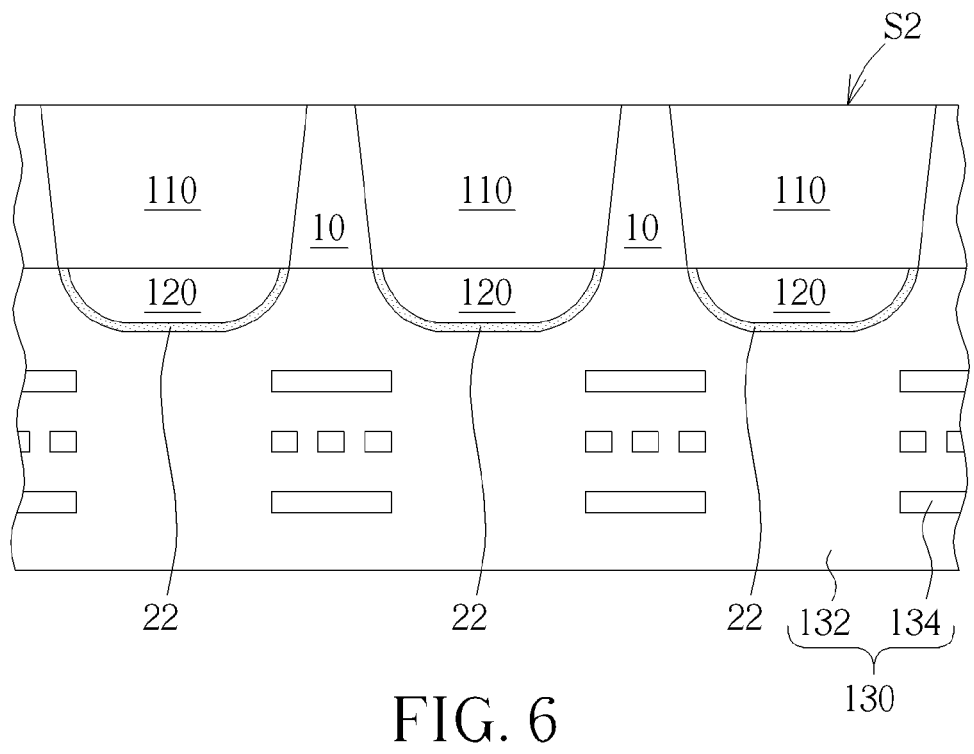

As shown in FIG. 6, the substrate 110 is disposed reversely, and then the substrate 110 is thinned down from the back side S2 of the substrate 110, (until the isolating material 10 being exposed preferably,) to electrically isolate each of the MOS transistors corresponding to each of the light sensing areas 120 to avoid circuit leakage and current flowing to the substrate 110. The substrate 110 thinning-down process may be a planarization process such as a chemical mechanical polishing (CMP) process, but it is not limited thereto.

Figure 7:
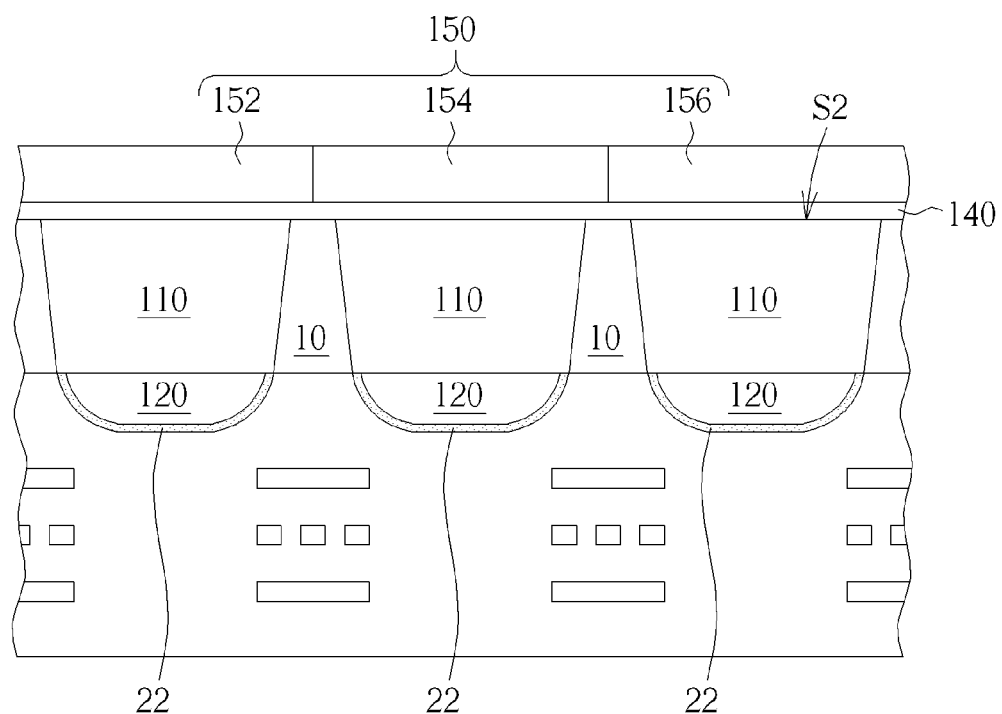

As shown in FIG. 7, a doping layer or/and an oxide layer (not shown) may be selectively formed on the back side S2, and then an anti-reflective layer 140 is formed on the substrate 110 (or the doping layer, the oxide layer). The anti-reflective layer 140 may be a silicon nitride layer, a silicon oxynitride layer, a carbon-doping silicon nitride layer, a carbon-doping silicon oxynitride layer etc. At least a color filter 150 is formed on the anti-reflective layer 140. In this embodiment, a patterned blue filter 152, a patterned green filter 154 and a patterned red filter 156 are respectively formed on the anti-reflective layer 140, but it is not limited thereto. In another embodiment, other color filters with other color series may be formed, depending upon the needs. It is worth noting that each of the light sensing areas 120 are formed between each of the corresponding color filters 150 and curved mirrors 22, and each of the curved mirrors 22 are disposed on the light path of light penetrating through the color filters 150. Thus, the curved mirrors 22 can receive the light filtered by the color filters 150, and then reflect back the light penetrating each of the light sensing areas 120 into the corresponding light sensing area 120. Preferably, the curved mirrors 22 can reflect the light into P-N junctions to increase the quantum efficiency of the light sensing areas 120, so that the light sensing sensitivity of the formed backside illumination (BSI) CMOS image sensor can be increased. The present invention is suitable for forming backside illumination (BSI) CMOS image sensors, but the present invention may also be applied in other applications.

Figure 8:
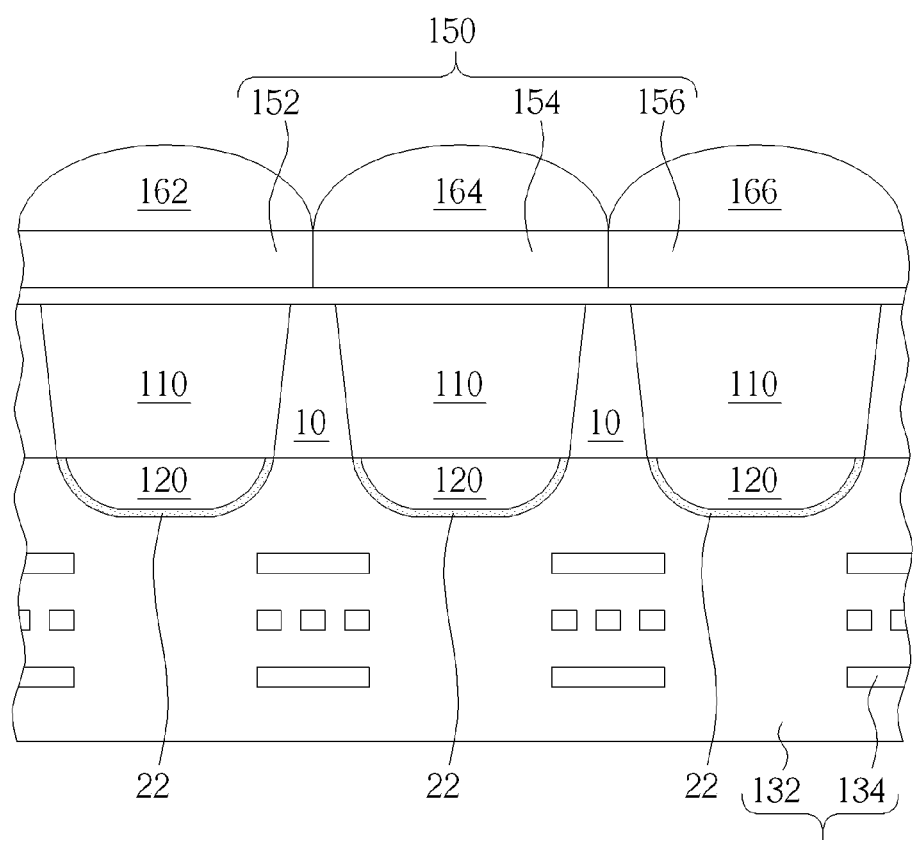

As shown in FIG. 8, a flat layer (not shown) may be selectively and respectively formed on each of the color filters 150. Microlenses 162, 164, 166 are respectively formed on each of the color filters 150 or the flat layer (not shown) to focus light emitted into each of the color filters 150. A passivation layer (not shown) may be selectively and respectively formed on each of the microlenses 162, 164, 166, and then later backside illumination (BSI) CMOS image sensing processes or outer electrical connection processes etc may be performed.

To summarize, the present invention provides a backside illumination (BSI) CMOS image sensing process, which forms at least a curved mirror on an active side of a substrate, so that incident light penetrating a light sensing area of the substrate can be reflected back to the light sensing area, so as to increase the quantum efficiency of the light sensing area. More precisely, the method for forming the curved mirror includes the following steps. A curving process is performed to curve the active side, and then a reflective layer is formed on the active side to form at least a curved mirror on the active side. In one case, the method of performing the curving process may include: etching the substrate from the active side to form a plurality of recesses in the substrate; performing an annealing process to curve the active side between each of the recesses, wherein the annealing process may be a hydrogen-containing annealing process, but it is not limited thereto.

In this embodiment, the light sensing area is a silicon-containing material such as a source or a drain of a MOS transistor, so that a salicide process can be performed directly to form a curved mirror on the source or the drain of the MOS transistors, but it is not limited thereto. In other embodiments, metal or a plurality of films with different reflective index can be formed to constitute the curved mirror.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A backside illumination (BSI) CMOS image sensing process, comprising:
    providing a substrate having an active side;
    performing a curving process to curve the active side, wherein steps of performing the curving process comprise etching the substrate from the active side to form a plurality of recesses in the substrate; and performing an annealing process to curve the active side between each of the recesses;
    filling an isolating material into each of the recesses after the annealing process is performed; and
    forming a reflective layer on the active side, thereby forming at least a curved mirror on the active side.

2. The backside illumination (BSI) CMOS image sensing process according to claim 1, wherein the surface of the curved mirror facing the substrate is a concave mirror.

3. The backside illumination (BSI) CMOS image sensing process according to claim 1, wherein the annealing process comprises a hydrogen-containing annealing process.

4. The backside illumination (BSI) CMOS image sensing process according to claim 3, wherein the processing temperature of the hydrogen-containing annealing process is larger than 1000° C.

5. The backside illumination (BSI) CMOS image sensing process according to claim 4, wherein the processing temperature of the hydrogen-containing annealing process is 1000° C., the processing pressure is 500 Torrs and the processing time is 3 minutes.

6. The backside illumination (BSI) CMOS image sensing process according to claim 1, wherein the isolating material comprises a shallow trench isolating material for forming a shallow trench isolation (STI) structure.

7. The backside illumination (BSI) CMOS image sensing process according to claim 1, further comprising:
    forming an oxide layer on part of the active side before the curving process is performed to prevent parts of the active side from being curved.

8. The backside illumination (BSI) CMOS image sensing process according to claim 1, wherein the method for forming the reflective layer comprises performing a salicide process to form a metal silicide on the active side.

9. The backside illumination (BSI) CMOS image sensing process according to claim 8, further comprising:
    forming an interconnect structure on the active side after the salicide process is performed.

10. The backside illumination (BSI) CMOS image sensing process according to claim 8, wherein the thickness of the metal silicide is larger than 200 angstroms.

11. The backside illumination (BSI) CMOS image sensing process according to claim 1, further comprising:
    forming a light sensing area in the substrate after the curving process is performed.

12. The backside illumination (BSI) CMOS image sensing process according to claim 11, wherein the focus of the curved mirror is located in the light sensing area.

13. The backside illumination (BSI) CMOS image sensing process according to claim 11, wherein the light sensing area comprises a P-N junction, and the focus of the curved mirror is located on the P-N junction.

14. The backside illumination (BSI) CMOS image sensing process according to claim 11, wherein the active side is a front side of the substrate, and the backside illumination (BSI) CMOS image sensing process further comprises:
    forming an interconnect structure on the active side after the reflective layer is formed;
    thinning down the substrate from a back side of the substrate; and
    forming at least a color filter on the back side.

15. The backside illumination (BSI) CMOS image sensing process according to claim 14, wherein the curved mirror is disposed on the light path of the light penetrating the color filter, and the light sensing area is located between the color filter and the curved mirror.

16. The backside illumination (BSI) CMOS image sensing process according to claim 14, further comprising:
    forming an anti-reflective layer on the back side before the color filter is formed.

17. The backside illumination (BSI) CMOS image sensing process according to claim 14, further comprising:
    forming a microlens on each of the color filter after the color filter is formed.

* * * * *